United States Patent
Imaizumi et al.

(10) Patent No.: US 10,401,151 B2
(45) Date of Patent: Sep. 3, 2019

(54) OPTICAL OUTER DIAMETER MEASUREMENT APPARATUS

(71) Applicant: MITUTOYO CORPORATION, Kawasaki, Kanagawa (JP)

(72) Inventors: Ryoichi Imaizumi, Kawasaki (JP); Ichirou Taniguchi, Yokohama (JP)

(73) Assignee: MITUTOYO CORPORATION, Kawasaki (JP)

( * ) Notice: Subject to any disclaimer, the term of this patent is extended or adjusted under 35 U.S.C. 154(b) by 0 days.

(21) Appl. No.: 15/937,119

(22) Filed: Mar. 27, 2018

(65) Prior Publication Data
US 2018/0299257 A1   Oct. 18, 2018

(30) Foreign Application Priority Data

Apr. 18, 2017   (JP) ................. 2017-081714

(51) Int. Cl.
*G01B 11/08*   (2006.01)
*G02B 26/12*   (2006.01)
(Continued)

(52) U.S. Cl.
CPC ............ *G01B 11/08* (2013.01); *G01B 5/0014* (2013.01); *G01B 11/2433* (2013.01); *G02B 26/12* (2013.01); *G02B 26/121* (2013.01); *G02B 26/125* (2013.01); *H05K 5/03* (2013.01); *H05K 7/20436* (2013.01); *H02K 9/22* (2013.01)

(58) Field of Classification Search
CPC .. G02B 6/0035; G02B 6/0038; G02B 6/0045; G02B 6/005; G02B 6/006; G02B 6/0063; G02B 6/0065; G02B 6/0068; G02B 6/0073; G02B 6/0076; G02B 6/0078; G02B 6/0095; G02B 26/12; G02B 26/121; G02B 26/125; G01B 11/2441; G01B 11/30; G01B 11/303; G01B 11/08; G01J 1/0407; G01J 1/0418; G01J 1/0425; G01J 1/0448; G01J 1/1626; G01J 1/22; G01J 1/4257; G01J 2001/0481; G01J 2001/4238;
(Continued)

(56) References Cited

U.S. PATENT DOCUMENTS

| | | | | |
|---|---|---|---|---|
| 6,142,285 A | * | 11/2000 | Panzeri | G07D 5/005 194/328 |
| 2016/0139062 A1 | * | 5/2016 | Faraldi | C03B 37/025 65/378 |
| 2018/0100732 A1 | * | 4/2018 | Akishiba | G01B 11/303 |

FOREIGN PATENT DOCUMENTS

| | | |
|---|---|---|
| JP | S59-83007 A | 5/1984 |
| JP | S62-174210 U | 11/1987 |

* cited by examiner

*Primary Examiner* — Michael P Stafira
(74) *Attorney, Agent, or Firm* — Oliff PLC (57) ABSTRACT

An optical outer diameter measurement apparatus includes a rotary device driven to rotate by a motor to convert light emitted from a light-emitting element into scanning light, a collimator lens configured to convert the scanning light into parallel scanning light that is projected toward an object to be measured, a condenser lens configured to condense the parallel scanning light having passed by the object to be measured, a light-receiving element configured to receive light condensed by the condenser lens, a housing that accommodates the rotary device and the collimator lens, and an optical-path cover including, in the housing, two walls extending in a scanning direction of the scanning light and located opposite each other with the scanning light between the two walls.

13 Claims, 6 Drawing Sheets

(51) Int. Cl.
*H05K 7/20* (2006.01)
*H05K 5/03* (2006.01)
*G01B 5/00* (2006.01)
*G01B 11/24* (2006.01)
*H02K 9/22* (2006.01)

(58) Field of Classification Search
CPC ...... G01J 2001/444; G01N 2021/3522; G01N 2021/536; G01N 21/3504
See application file for complete search history.

OPTICAL OUTER DIAMETER MEASUREMENT APPARATUS

BACKGROUND

This disclosure relates to an optical outer diameter measurement apparatus.

An optical outer diameter measurement apparatus is disclosed (refer to, for example, JP-U-62-174210 and JP-A-59-83007). This optical outer diameter measurement apparatus is designed such that a light beam reflected and converted into scanning light by a rotary mirror is collimated by a collimator lens, and an object to be measured is disposed between the collimator lens and a condenser lens, thus making it possible to measure the dimensions of the object to be measured.

SUMMARY

However, air may be disturbed, for example, by a current of air, caused by rotation of the rotary mirror, or by heat of a motor that rotates the rotary mirror. In a case where disturbance of air occurs, an optical path may be disturbed, decreasing measurement precision.

One object is to provide an optical outer diameter measurement apparatus capable of improving measurement precision.

An optical outer diameter measurement apparatus according to some embodiments includes: a rotary device driven to rotate by a motor to convert light emitted from a light-emitting element into scanning light; a collimator lens configured to convert the scanning light into parallel scanning light that is projected toward an object to be measured; a condenser lens configured to condense the parallel scanning light having passed by the object to be measured; a light-receiving element configured to receive light condensed by the condenser lens; a housing that accommodates the rotary device and the collimator lens; and an optical-path cover including, in the housing, two walls extending in a scanning direction of the scanning light and located opposite each other with the scanning light between the two walls.

In the optical outer diameter measurement apparatus, the rotary device may be a polygonal columnar rotary mirror whose outer periphery is formed of a plurality of flat faces.

The optical outer diameter measurement apparatus described above may include a heat dissipation plate having a thermal conductivity less than a thermal conductivity of the housing, the heat dissipation plate being thermally connected to the motor, and extending at least to an inner face of a wall of the housing.

With the above structure, it is possible to provide an optical outer diameter measurement apparatus capable of improving measurement precision.

DETAILED DESCRIPTION

Comparative Example

Figure 1:
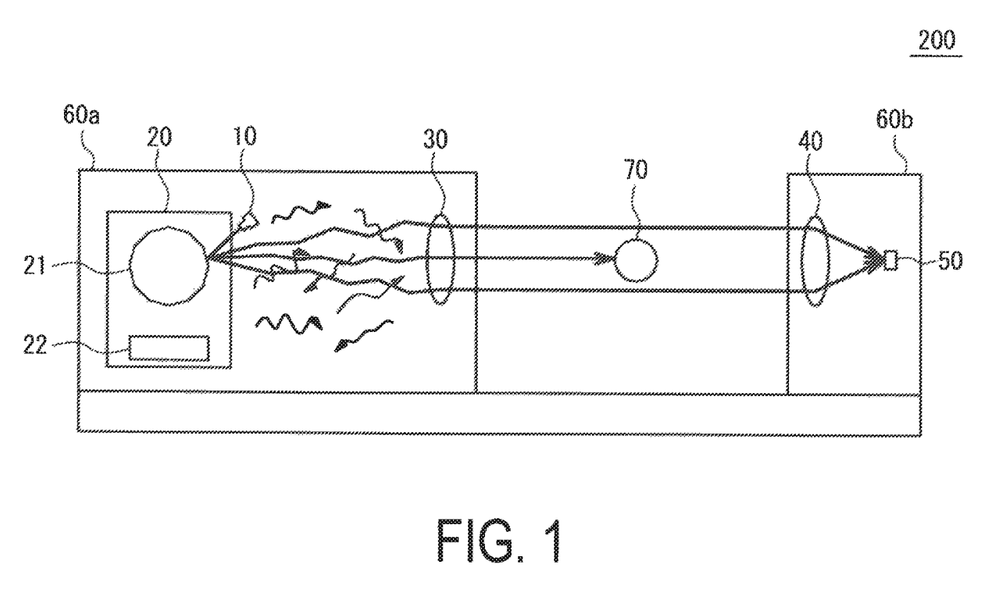
FIG. 1 is a schematic view of an optical outer diameter measurement apparatus according to a comparative example.

Prior to a description of embodiments, a comparative example will be described, FIG. 1 is a schematic view of an optical outer diameter measurement apparatus 200 according to the comparative example. As exemplified in FIG. 1, the optical outer diameter measurement apparatus 200 includes a light-emitting element 10, a scanner 20, a collimator lens 30, a condenser lens 40, and a light-receiving element 50.

The scanner 20 includes a rotary mirror 21 and a motor (electric motor) 22. The light-emitting element 10, scanner 20, and collimator lens 30 are arranged in a housing 60a in the shape of an approximately rectangular parallelepiped. The condenser lens 40 and light-receiving element 50 are arranged in a housing 60b in the shape of an approximately rectangular parallelepiped.

The light-emitting element 10 is a light-emitting element such as a laser diode. The rotary mirror 21 repeatedly makes light from the light-emitting element 10 incident on an incident face of the collimator lens 30 from one end position of a predetermined range of the incident face of the collimator lens 30 to the other end position thereof. Specifically, the rotary mirror 21 makes scanning light incident on the incident face of the collimator lens 30 within the predetermined range. For example, the rotary mirror 21 is a polygonal columnar rotary mirror whose outer periphery is formed of a plurality of flat faces. The motor 22 is configured to control rotation of the rotary mirror 21.

The collimator lens 30 is configured to convert scanning light, made incident from the rotary mirror 21, into parallel scanning light. The parallel scanning light is condensed by the condenser lens 40 and is made incident on the light-receiving element 50. An object 70 to be measured is disposed between the collimator lens 30 and the condenser lens 40. In a case where the parallel scanning light is not blocked by the object 70 to be measured, the quantity of light received by the light-receiving element 50 is increased. Conversely, in a case where the parallel scanning light is blocked by the object 70 to be measured, the quantity of light received by the light-receiving element 50 is decreased. Accordingly, the outer diameter of the object 70 to be measured can be measured from the rotating speed of the rotary mirror 21, the time at which a quantity of light received by the light-receiving element 50 is large, and the time at which a quantity of light received by the light-receiving element 50 is small.

However, air may be disturbed by a change in air pressure, such as a current of air, caused by rotation of the rotary mirror 21. In addition, a temperature distribution caused by heat generated by the motor 22 may also disturb air. As just described, air may be disturbed for some reason. In a case where air disturbance occurs, the wavelength of light and the index of refraction of the optical path may be affected. As a result, error may occur in measurement of the object 70 to be measured. In particular, since the scanner 20 is disposed in the housing 60a, the effect of air disturbance resulting from the scanner 20 may become significant between the scanner 20 and the collimator lens 30.

Therefore, the respective optical outer diameter measurement apparatuses according to the embodiments described below are provided with an optical-path cover between the rotary mirror 21 and the collimator lens 30 to improve measurement precision. The detailed description will now be given below.

First Embodiment

Figure 2A:
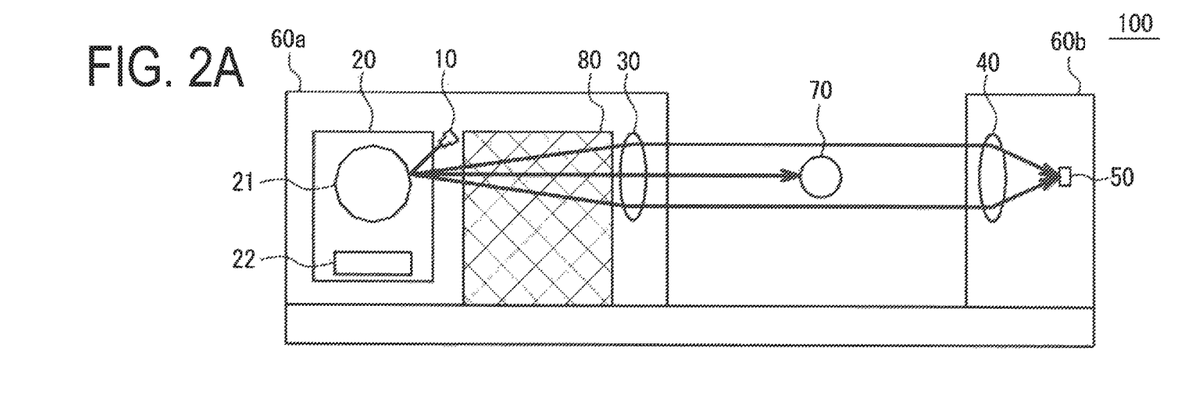
FIG. 2A is a schematic view of an optical outer diameter measurement apparatus according to a first embodiment.

FIG. 2A is a schematic view of an optical outer diameter measurement apparatus 100 according to a first embodiment. As exemplified in FIG. 2A, the optical outer diameter measurement apparatus 100 is provided with an optical-path cover 80 between a rotary mirror 21 and a collimator lens 30. A description of configurations of the optical outer diameter measurement apparatus 100 identical to configurations of the optical outer diameter measurement apparatus 200 in FIG. 1 is omitted, as components and the like in the optical outer diameter measurement apparatus 100 identical to those in the optical outer diameter measurement apparatus 200 are labeled with symbols identical to those in the optical outer diameter measurement apparatus 200.

Figure 2B:
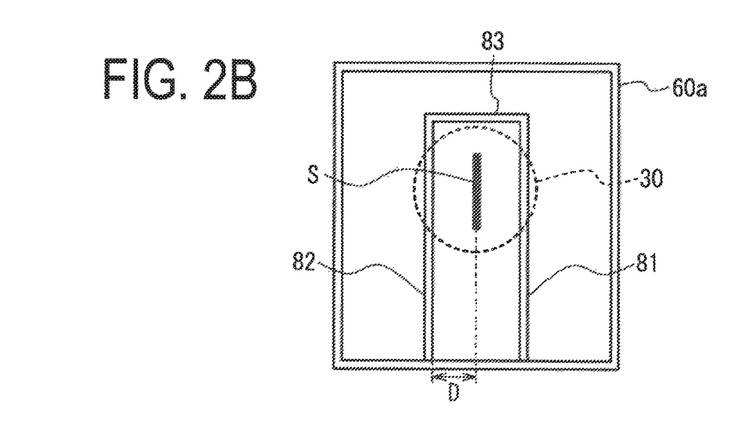
FIG. 2B is a view of an optical-path cover as viewed from the rotary mirror side.

FIG. 2B is a view of the optical-path cover 80 as viewed from the rotary mirror 21 side. As exemplified in FIG. 2B, in the present embodiment, scanning light S made incident on the collimator lens 30 from the rotary mirror 21 has a vertical scanning direction, for example. An optical-path cover 80 is disposed in a housing 60a. The optical-path cover 80 includes two walls 81, 82 extending in the scanning direction of scanning light S made incident on the collimator lens 30, and being opposite each other with the scanning light S therebetween. The respective faces of the walls 81, 82 opposite to the faces facing the scanning light S are separated from the housing 60a by gaps except where their ends are attached to the lower wall of the housing 60a. The wall 81 and the wall 82 are connected to each other via a wall 83 at their respective upper ends. The wall 83 is located above the scanning light S.

According to the present embodiment, since at least some air disturbance is blocked by the optical-path cover 80, the influence of air disturbance on the optical path of the scanning light S is reduced. This allows improved measurement precision of the optical outer diameter measurement apparatus 100. In particular, the walls 81, 82 extend in the scanning direction of the scanning light S and are opposite each other with the scanning light S therebetween. Therefore, an effect is yielded such that flow rate of air entering the optical path of the scanning light S is reduced, thus inhibiting air disturbance particularly in the optical path of the scanning light S. In a case where a wall located perpendicular to the scanning direction of the scanning light S is provided, as with the wall 83, and the distance between the wall and the scanning light S is small, a current of air produced by the rotary mirror 21 may stay in the optical path, resulting in the possibility that air disturbance may increase. That is, the current of air produced by the rotary mirror 21 may directly impinge upon the wall 83 because the wall 83 extends in a direction perpendicular to the direction of the air current. Therefore, in a case where a wall is provided perpendicular to the scanning direction of the scanning light S, it is preferable to ensure a sufficient distance from the scanning light S.

Figure 3A:
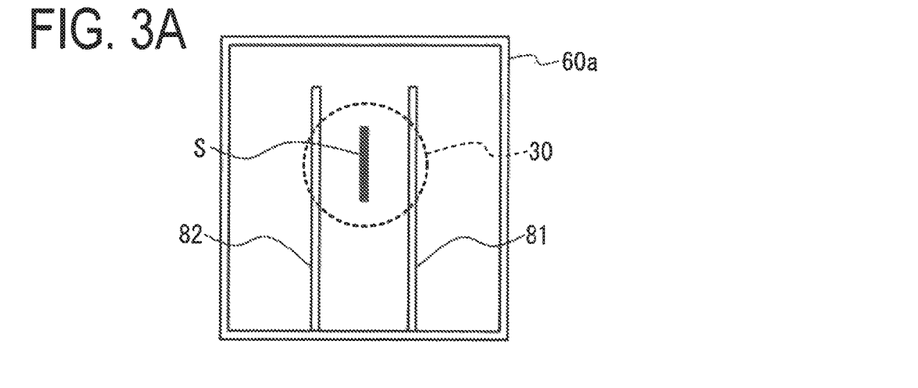
FIG. 3A is another example of the optical-path cover.

Note that the structure of the optical-path cover 80 is not limited to the structure illustrated in FIG. 2B. An optical-path cover 80 needs only to include two walls extending in the scanning direction of scanning light S and being opposite each other with the scanning light S therebetween. For example, as exemplified in FIG. 3A, an optical-path cover 80 needs not to have a wall 83, unlike in FIG. 2B. For example, respective upper ends of walls 81, 82 may be separated from each other and from the inner face of the upper wall of a housing 60a.

Figure 3B:
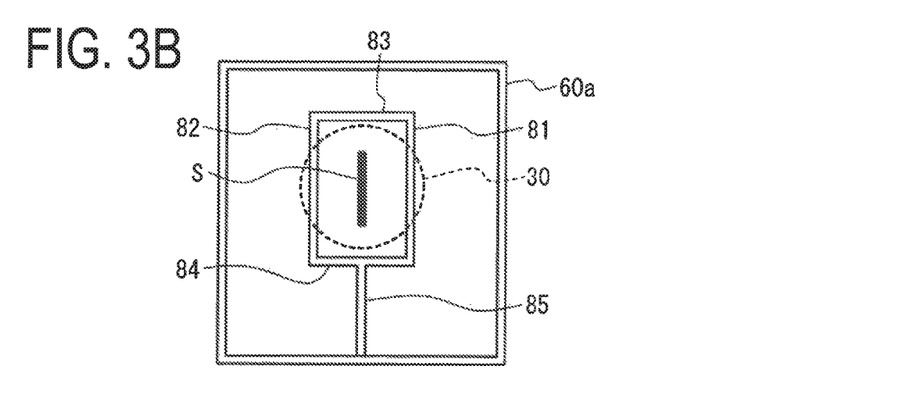
FIG. 3B is yet another example of the optical-path cover.

Alternatively, as exemplified in FIG. 3B, an optical-path cover 80 may include: walls 81, 82; a wall 83 connecting respective upper ends of the walls 81, 82; a wall 84 connecting respective lower ends of the walls 81, 82; and a fixing member 85 fixing the walls 81 to 84 in a housing 60a. In this case, the wall 84 is located under scanning light S.

To inhibit air disturbance, it is preferable that the respective lengths of the walls 81, 82 extending in the scanning direction of scanning light S be greater than the scanning width (i.e., the length in the scanning direction) of the scanning light S. In addition, to inhibit air disturbance, it is preferable that the walls 81, 82 be located near the scanning light S. For example, as exemplified in FIG. 2B, it is preferable that the distance D between each wall 81, 82 and the scanning light S be short. However, the distance is preferably greater than a value which is the sum of (1) the diameter of the scanning light S used, and (2) the accuracy (fluctuation amount (or wobble)) of rotation of the rotary mirror 21, and the like. Meanwhile, in a case where the distance D between each wall 81, 82 and the scanning light S is too short, the scanning light S and each wall may interfere, leading to a problem such that the scanning light S does not reach the light-receiving element. Therefore, the distance D between each wall 81, 82 and the scanning light S is preferably greater than the value which is the sum of (1) the diameter of the scanning light S used, and (2) the accuracy (fluctuation amount (or wobble)) of rotation of the rotary mirror 21, and the like.

Second Embodiment

Figure 4:
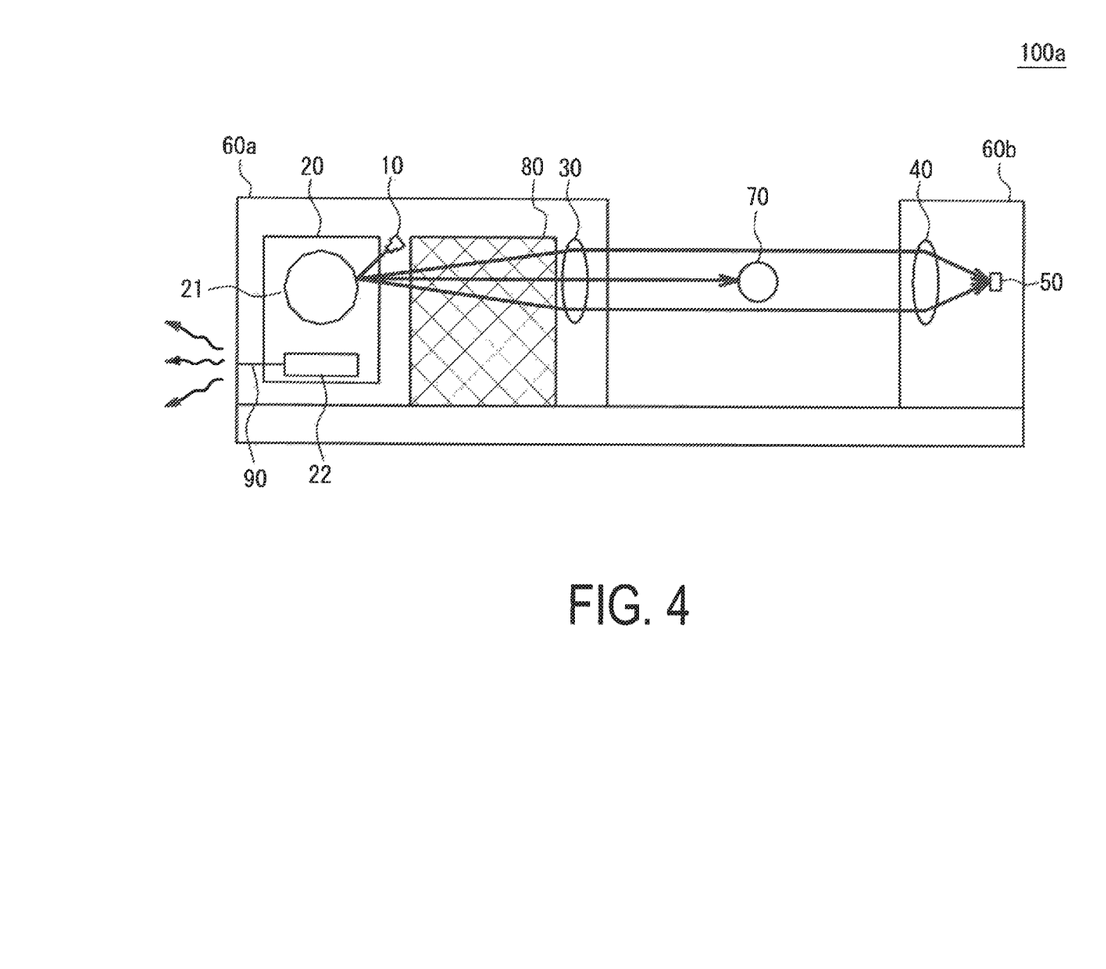
FIG. 4 is a schematic view of an optical outer diameter measurement apparatus according to a second embodiment.

FIG. 4 is a schematic view of an optical outer diameter measurement apparatus 100a according to a second embodiment. As exemplified in FIG. 4, the optical outer diameter measurement apparatus 100a differs from the optical outer diameter measurement apparatus 100 in FIG. 2A in that the apparatus 100a further includes a heat dissipation member 90. The heat dissipation member 90 is made of a material having greater thermal conductivity than that of a housing 60a. In the present embodiment, a motor 22 is thermally connected with the heat dissipation member 90. For example, the motor 22 is disposed in contact with the heat dissipation member 90 or mounted on the heat dissipation member 90. By virtue of this, heat generated by the motor 22 is readily conducted to the heat dissipation member 90. In addition, the heat dissipation member 90 is in contact with or passes through one of the walls of the housing 60a. By virtue of this, heat generated by the motor 22 can be dissipated out of the housing 60a. Accordingly, air disturbance resulting from heat generated by the motor 22 can be inhibited.

Third Embodiment

Figure 5:
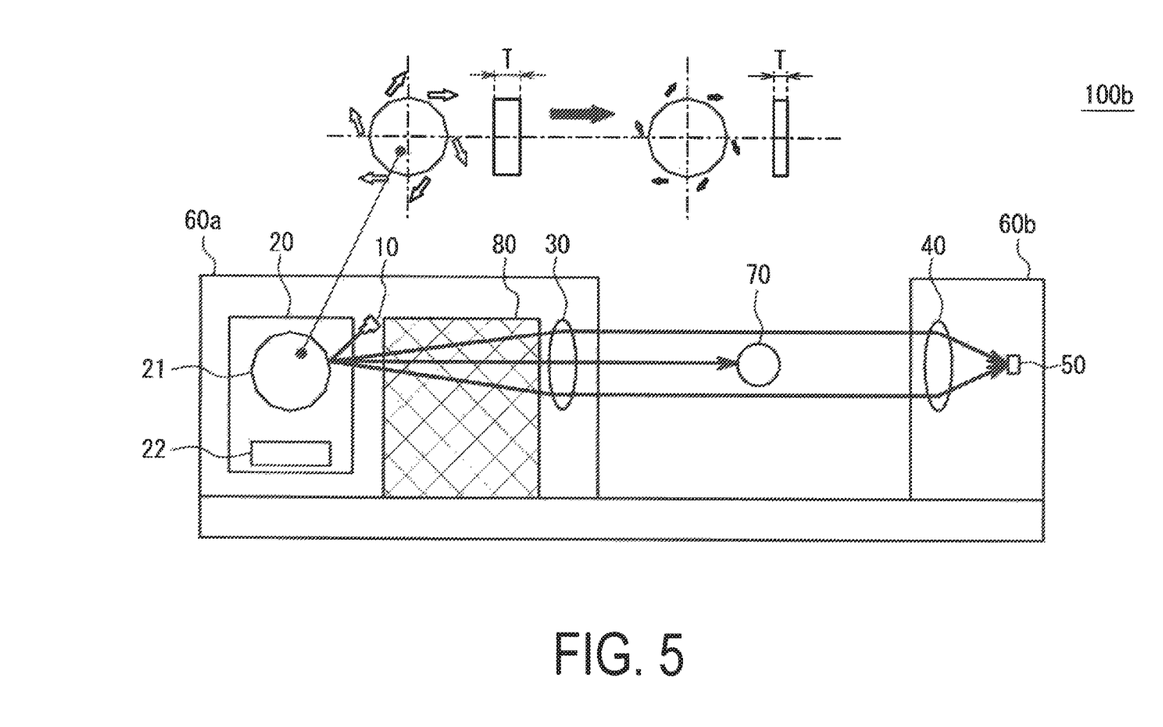
FIG. 5 is a schematic view of an optical outer diameter measurement apparatus according to a third embodiment.

FIG. 5 is a schematic view of an optical outer diameter measurement apparatus 100b according to a third embodiment. As exemplified in FIG. 5, the optical outer diameter measurement apparatus 100b differs from the optical outer diameter measurement apparatus 100 in FIG. 2A in that the shape of a rotary mirror 21 is specified. Air flow caused by rotation of the rotary mirror 21 increases with the thickness of the rotary mirror 21 (thickness of the mirror is in the horizontal direction (direction perpendicular to the scanning direction of the scanning light S) in the illustrated examples). A smaller thickness of the rotary mirror 21 is, therefore, preferable. Therefore, the thickness of the rotary mirror 21 is preferably greater than the value which is the sum of (1) the diameter of the scanning light S used, and (2) the accuracy (fluctuation amount (or wobble)) of rotation of the rotary mirror 21, and the like. Note that the direction of thickness of the rotary mirror 21 is the direction of height of a polygonal column.

Air flow caused by rotation of the rotary mirror 21 also increases with increase in the diameter of the rotary mirror 21. A small diameter for the rotary mirror 21 is, therefore, preferable. However, the diameter of the rotary mirror 21 is preferably a diameter capable of ensuring the scanning range required by a product. Note that the diameter of the rotary mirror 21 is the distance from the rotation center of the rotary mirror to each vertex of a polygon.

Air flow caused by rotation of the rotary mirror 21 increases as unevenness on the outer periphery of the rotary mirror 21 increases. Therefore, it is preferable that a polygon forming the rotary mirror 21 be as circular as possible. However, the shape of the rotary mirror 21 is preferably a shape capable of ensuring a scanning range required by a product.

In each embodiment, the rotary mirror 21 functions as an example of a rotary device that converts light from the light-emitting element into scanning light by motor-driven rotation. The collimator lens 30 functions as an example of a collimator lens that converts the scanning light into parallel scanning light. The condenser lens 40 functions as an example of a condenser lens that condenses the parallel scanning light passed through an object to be measured. The light-receiving element 50 functions as an example of a light-receiving element that receives light condensed by the condenser lens. The housing 60a functions as an example of a housing for accommodating the rotary device and the collimator lens. The optical-path cover 80 functions as an example of an optical-path cover that includes two walls extending in a scanning direction of the scanning light and located opposite each other with the scanning light therebetween.

EXAMPLES

Example 1

Measurement precision was checked when the outer diameter of an object 70 to be measured was measured according to the embodiments described above. As an object 70 to be measured, a cylindrical gauge of φ30 mm was used. In Example 1, walls 81 to 84 were provided as exemplified in FIG. 3B, and measurement precision (repetition precision: a value of ±2σ (σ is a standard deviation) when measuring time was 0.32 sec (average of 1024 times)) was measured.

Example 2

In Example 2, measurement precision was obtained as with Example 1, except that walls 81 to 83 are provided as in FIG. 2B.

Comparative Example

In the comparative example, measurement precision was obtained as with Example 1, except that none of the walls 81 to 84 was provided as in FIG. 1.

Analysis

Figure 6:
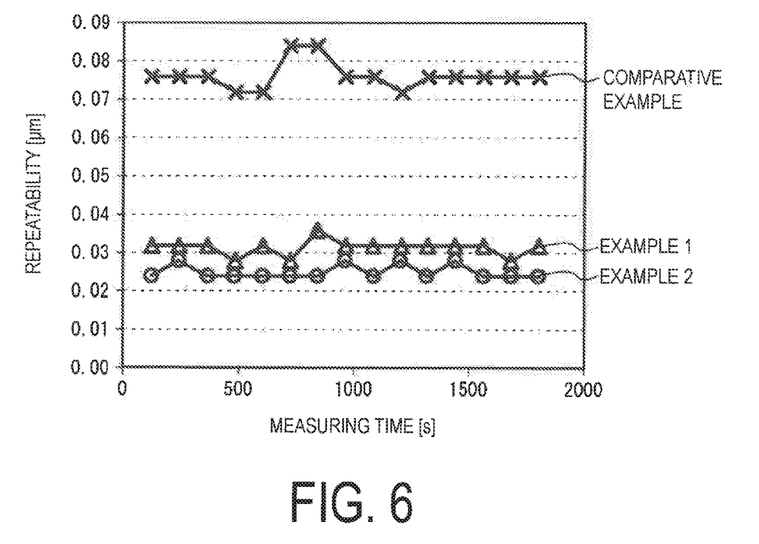
FIG. 6 is a graph showing respective measurement precisions of examples of embodiments and of the comparative example.

FIG. 6 shows respective measurement precisions of Examples 1, 2 and the comparative example. As shown in FIG. 6, in the comparative example, the value of measurement precision was large. That is, variation in measurements was large. This is because since an optical-path cover for scanning light S was not provided, air disturbance in the optical path of the scanning light S could not be inhibited. In contrast, the respective values of measurement precision in Examples 1, 2 were small. That is, variation in measurements in each example was small. This is because provision of an optical-path cover including two walls 81, 82, extending in the scanning direction of scanning light S and located opposite each other with the scanning light S therebetween, inhibited air disturbance in the optical path of the scanning light S. In addition, the value of measurement precision in Example 2 was smaller than that in Example 1. This is because since a wall 84 located perpendicular to the scanning direction of the scanning light S was not provided, a current of air, caused by the rotary mirror 21, was prevented from staying in the optical path.

Although embodiments and examples have been described above, it is to be understood that the invention is not limited to the specific embodiments and examples and that various changes and modifications may be made.

The invention claimed is:
1. An optical outer diameter measurement apparatus comprising:
a rotary device driven to rotate by a motor to convert light emitted from a light-emitting element into scanning light;
a collimator lens configured to convert the scanning light into parallel scanning light that is projected toward an object to be measured;
a condenser lens configured to condense the parallel scanning light having passed by the object to be measured;
a light-receiving element configured to receive light condensed by the condenser lens;
a housing that accommodates the rotary device and the collimator lens; and
an optical-path cover including, in the housing, two walls extending in a scanning direction of the scanning light and located opposite each other with the scanning light between the two walls, wherein
the two walls of the cover are spaced by gaps from two walls of the housing that extend parallel to the two walls of the cover, the gaps being located between the two walls of the cover and the two walls of the housing that extend parallel to the two walls of the cover.
2. The optical outer diameter measurement apparatus according to claim 1, wherein the rotary device is a polygonal columnar rotary mirror whose outer periphery is formed of a plurality of flat faces.
3. The optical outer diameter measurement apparatus according to claim 1, further comprising a heat dissipation plate having a thermal conductivity less than a thermal conductivity of the housing, the heat dissipation plate thermally connected to the motor, and extending at least to an inner face of a wall of the housing.
4. The optical outer diameter measurement apparatus according to claim 2, further comprising a heat dissipation plate having a thermal conductivity less than a thermal conductivity of the housing, the heat dissipation plate thermally connected to the motor, and extending at least to an inner face of a wall of the housing.

5. The optical outer diameter measurement apparatus according to claim 1, wherein the cover includes a third wall that interconnects adjacent first ends of the two walls of the cover, the third wall of the cover being spaced from an adjacent wall of the housing.

6. The optical outer diameter measurement apparatus according to claim 5, wherein the cover includes a fourth wall that interconnects adjacent second ends of the two walls of the cover, the fourth wall of the cover being connected to the housing.

7. An optical outer diameter measurement apparatus comprising:
  a movable reflective member;
  an actuator that moves the movable reflective member to convert light emitted from a light-emitting element into scanning light;
  a collimator lens positioned to convert the scanning light into parallel scanning light that is projected toward an object to be measured;
  a condenser lens configured to condense the parallel scanning light having passed by the object to be measured;
  a light-receiving element configured to receive light condensed by the condenser lens;
  a housing in which the movable reflective member, the actuator and the collimator lens are accommodated; and
  an optical-path cover including, in the housing, two walls extending in a scanning direction of the scanning light and located opposite each other with the scanning light between the two walls, wherein
  the two walls of the cover are spaced by gaps from two walls of the housing that extend parallel to the two walls of the cover, the gaps being located between the two walls of the cover and the two walls of the housing that extend parallel to the two walls of the cover.

8. The optical outer diameter measurement apparatus according to claim 7, wherein the movable reflective member has a plurality of reflective surfaces.

9. The optical outer diameter measurement apparatus according to claim 7, wherein the actuator is a motor that moves the movable reflective member.

10. The optical outer diameter measurement apparatus according to claim 9, wherein the motor rotates the movable reflective member.

11. The optical outer diameter measurement apparatus according to claim 7, further comprising a heat dissipation plate having a thermal conductivity less than a thermal conductivity of the housing, the heat dissipation plate thermally connected to the actuator, and extending at least to an inner face of a wall of the housing.

12. The optical outer diameter measurement apparatus according to claim 7, wherein the cover includes a third wall that interconnects adjacent first ends of the two walls of the cover, the third wall of the cover being spaced from an adjacent wall of the housing.

13. The optical outer diameter measurement apparatus according to claim 7, wherein the cover includes a fourth wall that interconnects adjacent second ends of the two walls of the cover, the fourth wall of the cover being connected to the housing.

\* \* \* \* \*